(12) United States Patent
Franco

(10) Patent No.: US 9,693,459 B2
(45) Date of Patent: Jun. 27, 2017

(54) CIRCUIT BOARD ASSEMBLY AND METHOD OF MANUFACTURING SAME

(71) Applicant: Delphi Technologies, Inc., Troy, MI (US)

(72) Inventor: Rodrigo Franco, Sao Paulo (BR)

(73) Assignee: Delphi Technologies, Inc., Troy, MI (US)

( * ) Notice: Subject to any disclaimer, the term of this patent is extended or adjusted under 35 U.S.C. 154(b) by 47 days.

(21) Appl. No.: 14/801,422

(22) Filed: Jul. 16, 2015

(65) Prior Publication Data

US 2017/0019998 A1    Jan. 19, 2017

(51) Int. Cl.
| H05K 1/11 | (2006.01) |
| H05K 1/14 | (2006.01) |
| H05K 1/18 | (2006.01) |
| H05K 3/32 | (2006.01) |
| H05K 3/36 | (2006.01) |
| H05K 3/42 | (2006.01) |
| H05K 3/40 | (2006.01) |

(52) U.S. Cl.
CPC ............. *H05K 1/144* (2013.01); *H05K 1/111* (2013.01); *H05K 1/115* (2013.01); *H05K 1/181* (2013.01); *H05K 3/32* (2013.01); *H05K 3/36* (2013.01); *H05K 3/4007* (2013.01); *H05K 3/429* (2013.01); *H05K 1/14* (2013.01); *H05K 1/141* (2013.01); *H05K 1/145* (2013.01); *H05K 2201/045* (2013.01); *H05K 2201/095* (2013.01)

(58) Field of Classification Search
CPC .......... H05K 1/14; H05K 1/141; H05K 1/144; H05K 1/145

USPC ................................ 361/784, 785, 790, 791
See application file for complete search history.

(56) References Cited

U.S. PATENT DOCUMENTS

| 6,717,820 | B1 | 4/2004 | Loh |
| 7,258,549 | B2 | 8/2007 | Asahi et al. |
| 7,807,499 | B2 | 10/2010 | Nishizawa |
| 8,379,403 | B2 | 2/2013 | Waite et al. |
| 2004/0022038 | A1 | 2/2004 | Figueroa et al. |
| 2008/0251906 | A1 | 10/2008 | Eaton et al. |
| 2009/0321921 | A1* | 12/2009 | Hwang ................... H01L 23/13 257/701 |
| 2013/0203274 | A1* | 8/2013 | Kraft ...................... H01R 12/52 439/74 |

\* cited by examiner

*Primary Examiner* — Binh Tran
(74) *Attorney, Agent, or Firm* — Robert J. Myers

(57) ABSTRACT

The circuit board assembly includes a first circuit board having a first plurality of electronic components attached to a major surface of the first circuit board. The first plurality of electronic components is electrically interconnected to a first plurality of conductive pads defined on the major surface of the first circuit board. A second circuit board has a second plurality of electronic components attached to a first major surface of the second circuit board. The second plurality of electronic components is electrically interconnected to a second plurality of conductive pads defined on a second major surface of the second circuit board. The first and second circuit board are attached by coupling the first and second plurality of conductive pads. A portion of the first plurality of electronic components on the first circuit board are disposed within a cavity defined by the second major surface of the second circuit board.

6 Claims, 4 Drawing Sheets

CIRCUIT BOARD ASSEMBLY AND METHOD OF MANUFACTURING SAME

TECHNICAL FIELD OF THE INVENTION

The invention relates to a circuit board assembly, particularly a circuit board assembly having a main (mother) circuit board and an auxiliary (daughter) circuit board.

BACKGROUND OF THE INVENTION

In order to achieve a space efficient package for an electronic assembly, a circuit board assembly may include a larger circuit board populated with various electronic components, often referred to as a "mother board" and a smaller auxiliary circuit board also populated with other electronic components, often referred to as a "daughter board" attached directly to the mother board. In order to avoid cost and reliability issues associated with board edge connectors, the daughter board may include conductive pads on the bottom surface of the daughter board that are soldered directly to corresponding conductive pads on the mother board. This mother/daughter board configuration also allows for easy customization of the circuit board assembly though the use of different daughter boards with a common mother board. However, component density on the mother board is not optimal since the component placement on the mother board must account for the circuit board space required for the entire length and width of the daughter board as well as the mother/daughter board connections. This typically provide less than optimal packaging for space efficiency. Therefore a circuit board assembly made up of a mother/daughter board combination that allows for more efficient packaging of electronic components remains to be desired.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

A circuit board assembly is presented herein. The circuit board assembly includes a main circuit board, hereinafter referred to as a mother board and a smaller auxiliary circuit board, hereinafter referred to as a daughter board each having various electronic components interconnected by conductive traces. The daughter board is directly mechanically and electrically connected to the mother board by conductive pads on the bottom surface of the daughter board that are soldered to corresponding conductive pads on the top surface of the mother board. A cavity or channel on the bottom surface of the daughter board encloses a portion of the electronic components mounted to the top surface of the mother board allowing some of the electronic components on the mother board to be located underneath the daughter board. This permits the size of the mother board to be reduced, since the entire length and width of the daughter board is not required to be a keep out zone when determining electronic component placement on the mother board. A method of manufacturing this circuit board assembly is also presented herein.

In accordance with an embodiment of the invention, a circuit board assembly is provided. The circuit board assembly includes a first circuit board having a first plurality of electronic components attached to a major surface of the first circuit board. The first plurality of electronic components is electrically interconnected by conductive traces to a first plurality of conductive pads defined on the major surface of the first circuit board. The circuit board assembly further includes a second circuit board having a second plurality of electronic components attached to a first major surface of the second circuit board. The second plurality of electronic components is electrically interconnected to a second plurality of conductive pads defined on a second major surface of the second circuit board opposite the first major surface. The first plurality of conductive pads are electrically and mechanically coupled to the second plurality of conductive pads. A portion of the first plurality of electronic components on the first circuit board are disposed within a cavity defined by the second major surface of the second circuit board.

The cavity defined in the second major surface of the second circuit board may be characterized as a channel in the second major surface extending from a first minor surface of the second circuit board to a second minor surface of the second circuit board. The conductive traces on the first major surface may be connected to the second plurality of conductive pads on the second major surface by conductive castellated vias defined in a third minor surface of the second circuit board.

In accordance with another embodiment of the invention, a daughter circuit board assembly is provided. The daughter circuit board assembly is configured to be electrically and mechanically coupled to a mother circuit board assembly having a first plurality of electronic components attached to a major surface of the mother circuit board assembly and electrically interconnected by conductive traces with a first plurality of conductive pads defined on the major surface of the mother circuit board assembly. The daughter circuit board assembly includes a circuit board having a second plurality of electronic components attached to a first major surface of the circuit board. The second plurality of electronic components is electrically interconnected with a second plurality of conductive pads defined on a second major surface of the circuit board opposite the first major surface. The second major surface defines a cavity that is configured to enclose a portion of the first plurality of electronic components of the mother circuit board assembly when the second plurality of conductive pads on the second major surface are electrically and mechanically coupled to the first plurality conductive pads on the major surface of the mother circuit board assembly.

The cavity defined in the second major surface of the circuit board may be characterized as a channel in the second major surface extending from a first minor surface of the circuit board to a second minor surface of the circuit board. The conductive traces on the first major surface of the circuit board may be connected to the second plurality of conductive pads on the second major surface of the circuit board by conductive castellated vias defined in a third minor surface of the circuit board.

In accordance with yet another embodiment of the invention, a method of manufacturing a circuit board assembly as described above is provided. The method includes the steps of:

providing a first circuit board having a first plurality of electronic components attached to a major surface of the first circuit board and electrically interconnected with a first plurality of conductive pads defined on the major surface of the first circuit board;

providing a second circuit board;

forming a plurality of conductive traces on a first major surface of the second circuit board;

forming a second plurality of conductive pads on a second major surface on the second circuit board opposite the first major surface;

forming a plurality of conductive vias interconnecting the plurality of conductive traces to the second plurality of conductive pads;

forming a cavity in the second major surface of the second circuit board;

electrically and mechanically coupling a second plurality of electronic components to the conductive traces of the second circuit board;

disposing a portion of the first plurality of electronic components within the cavity defined by the second major surface; and electrically and mechanically coupling the second plurality of conductive pads of the second circuit board to the first plurality of conductive pads of the first circuit board.

The cavity may be characterized as a channel in the second major surface extending from a first minor surface of the second circuit board to a second minor surface of the second circuit board. The plurality of conductive traces on the first major surface of the second circuit board may be connected to the second plurality of conductive pads on the second major surface of the second circuit board by conductive castellated vias defined in a third minor surface of the second circuit board. The steps of the method may be performed in the order listed.

BRIEF DESCRIPTION OF THE SEVERAL VIEWS OF THE DRAWING

The present invention will now be described, by way of example with reference to the accompanying drawings, in which.

Similar elements of various embodiments shown in the figures may be designated by a prime mark following the reference number, e.g. 7, 7'.

DETAILED DESCRIPTION OF THE INVENTION

Figure 1:
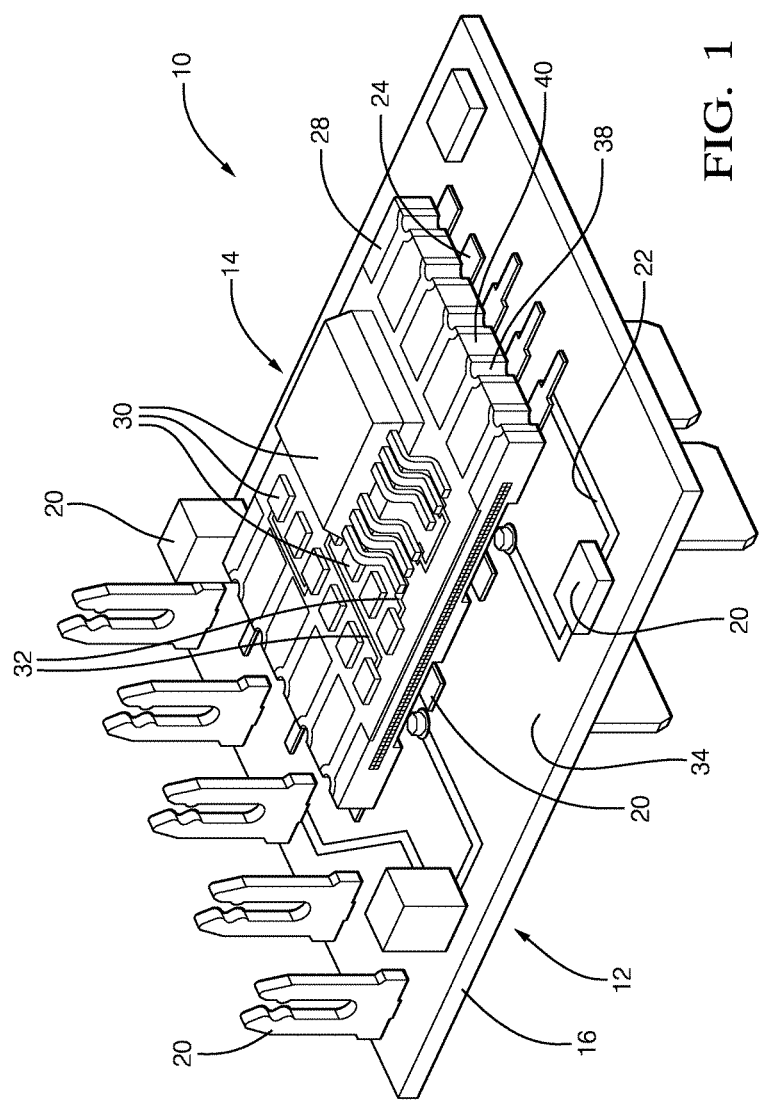
FIG. 1 is perspective top view of a circuit board assembly according to one embodiment.
Figure 2:
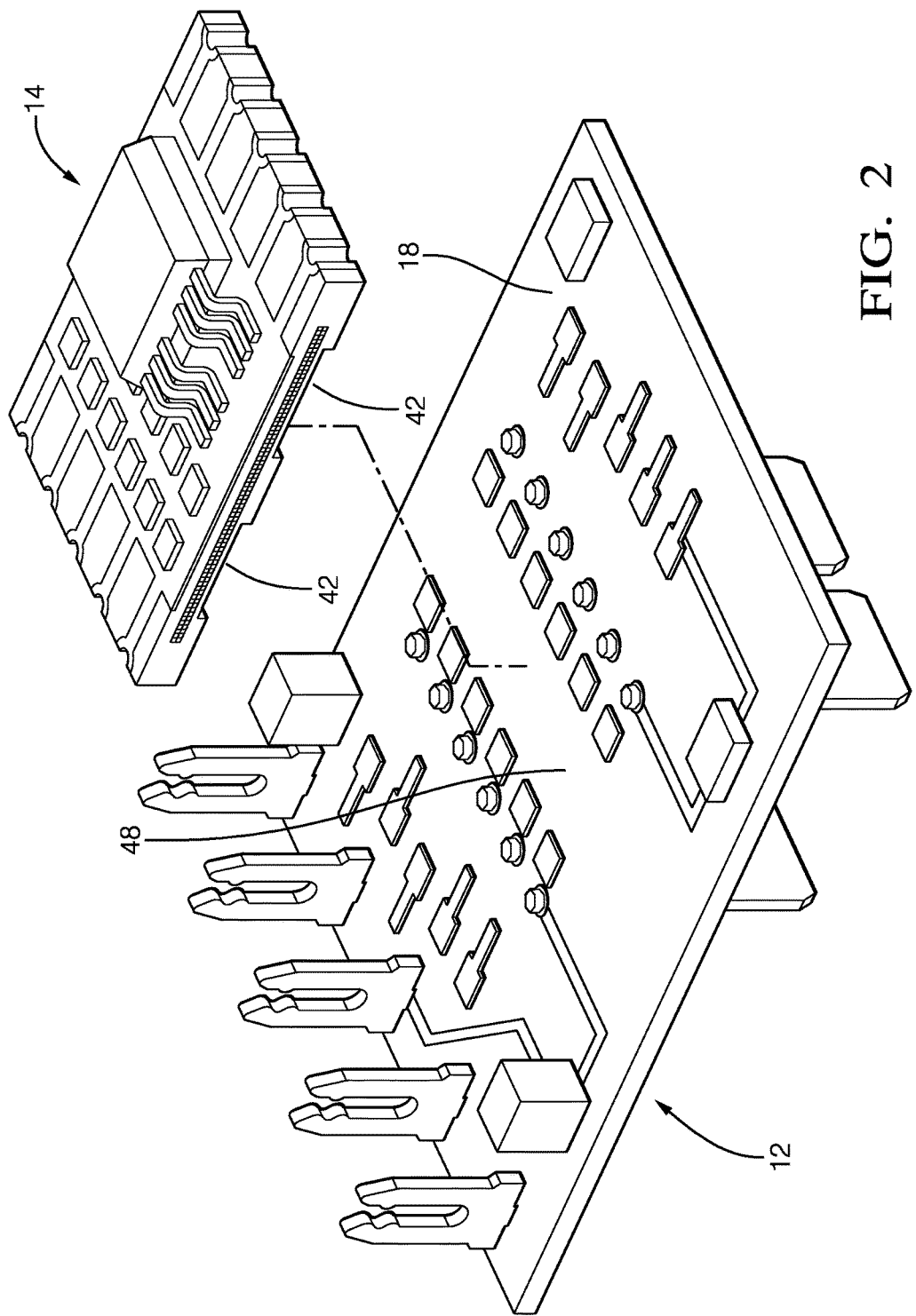
FIG. 2 is an exploded perspective view of the circuit board assembly of FIG. 1 according to one embodiment.

FIG. 1 shows a non-limiting example of circuit board assembly 10 according to one embodiment of the invention. The circuit board assembly 10 includes a mother board 12 and a daughter board 14. The mother board 12 includes a generally planar printed circuit board (PCB) 16 having a conductive trace 22 on at least one major surface 18 of the PCB 16, in this example a top surface 18 of the PCB 16. A first plurality of electronic components 20, such as relays, resistors, capacitors, diodes, power transistors and/or blade terminals are electrically and mechanically connected, e.g. soldered, to the conductive traces 18 on the PCB 16 of the mother board 12. Some of the conductive traces 22 are terminated by a first plurality of conductive pads 24 that are configured to be connected to a corresponding second plurality of conductive pads 26 on the daughter board 14.

The daughter board 14 also includes a generally planar printed circuit board (PCB) 28 that according to this non-limiting example has a smaller width and length than the mother board 12. The PCB 28 of the daughter board 14 also has a number of conductive traces 32 on a first major surface 34 of the PCB 28, in this example a top surface 34 of the PCB 28. A second plurality of electronic components 30, such as resistors, capacitors, and/or integrated circuits are electrically and mechanically connected, e.g. soldered, to the conductive traces 32 on the PCB 28 of the daughter board 14. Some of the conductive traces 32 are connected to the conductive pads 26 on a second major surface 36 of the PCB 28, in this example a bottom surface 36 of the PCB 28 shown in FIG. 3. The conductive traces 32 are configured to be connected to corresponding conductive pads 26 on the daughter board 14.

The PCBs 16, 28 of the mother board 12 and daughter board 14 may use circuit board substrates that are formed of epoxy or polyimide resins. The resin may be reinforced with a woven glass cloth or other matrix such as chopped fibers. Substrates formed of such materials are typically referred to as FR-4 or G-10 type circuit boards. The circuit board substrate may alternatively be constructed of ceramic or rigid polymer materials. This listing of acceptable substrate materials is not exhaustive and other materials may also be used successfully. A layer of conductive material, such as a copper based material is deposited on at least one major surface of the circuit board substrate. The layer of conductive material is then formed to create the conductive traces 22, 32 and conductive pads 24, 26, typically by using a chemical etching process. The materials and manufacturing techniques used to the form PCBs 16, 28 are well known to those skilled in the art.

The conductive traces 32 on the top surface 34 of the daughter board 14 are connected to the conductive pads 26 on the bottom surface 36 of the daughter board 14 by conductive castellated vias 38 defined in a minor surface 40, or edge surface 40, of the daughter board 14. The castellated vias 38 are a known feature for connecting one PCB 28, e.g. a daughter board 14 to another PCB 16, e.g. a mother board 12. Castellated vias 38 are also referred to as half-vias, edge-plating, and leadless chip carrier (LLC). These castellated vias 38 may be created by forming plated through hole vias terminating a conductive trace 32 near an edge of the PCB 28 and then cutting a new edge 40 of the circuit board that cuts the though the through hole vias. Because the castellated vias 38 are platted and have a concave shape, they are suitable for soldering the daughter board 14 to the mother board 12.

Figure 3:
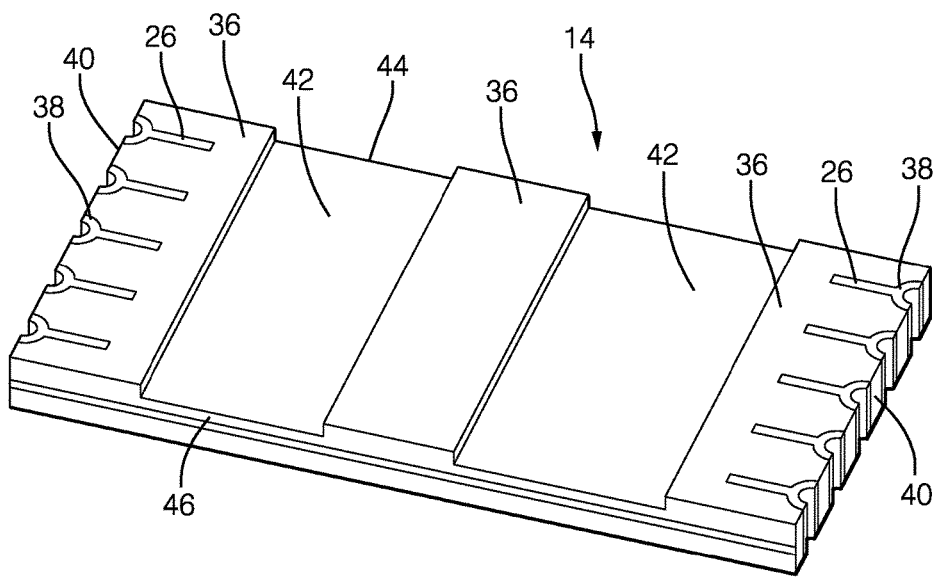
FIG. 3 is a perspective bottom view of a daughter board of the circuit board assembly of FIG. 1 according to one embodiment.
Figure 4:
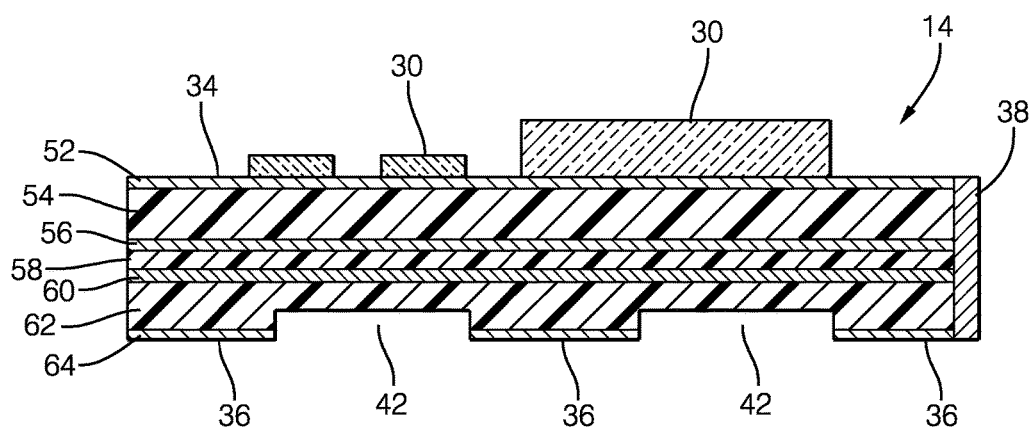
FIG. 4 is a side cut-away view of a daughter board of FIG. 3 according to one embodiment.

As best shown in FIGS. 3 and 4, the bottom surface 36 of the daughter board 14 defines a cavity 42 or indentation. In the illustrated example, the cavity 42 is a pair of generally parallel channels 42 that extend from one edge 44 of the daughter board 14 to an opposite edge 46. A portion 48 of the first plurality of electronic components 20 are arranged on the top surface 18 of the mother board 12 so that when the daughter board 14 is attached to the mother board 12, this portion 40 of electrical components 20 are disposed within the cavity 42 and are thus packaged under the daughter board 14.

The cavity 42 may be formed in the bottom surface 36 of the daughter board 14 by a subtractive process, such as milling or grinding, after the conductive traces 32 have been formed on the PCB 28 or even after the electronic components 30 have been soldered to the conductive traces 32. The thickness of the daughter board 14 may exceed the thickness of the mother board 12. As illustrated in FIG. 4, the depth of the cavity 42 is preferably determined so that cavity 42 can accommodate the tallest component of the portion 40 of electrical components 20 on the mother board 12. The thickness of the daughter board 14 may be determined so that the daughter board 14 maintains adequate structural rigidity and so that the cavity 42 avoids interruption of any internal conductive layers 56, 60 within the daughter board 14. The width of the cavity 42 is determined so that there is no interference with the portion 48 of electronic components 20 on the mother board 12. For example, the overall thickness of the daughter board 14 may be about 3 millimeters (mm) while the depth of the cavity 42 may be about 0.8 mm. The daughter board 14 may be formed by laminating a top conductive layer 52 having a thickness of about 18 micrometers (μm), a top substrate 54 having a thickness of about 1.3 mm, a first inner conductive layer 56 having a thickness of about 18 μm, a middle substrate 58 having a thickness of about 0.4 mm, a second inner conductive layer 60 having a thickness of about 18 μm, a bottom substrate 62 having a thickness of about 1.3 mm and a bottom conductive layer 64 also having a thickness of about 18 μm to one another.

Alternatively, the cavity 42 may only extend to one edge 44 of the daughter board 14. In fact, the cavity 42 may be formed to have any shape required to accommodate the first plurality of electronic components 20 on the top surface 18 of the mother board 12.

Figure 5:
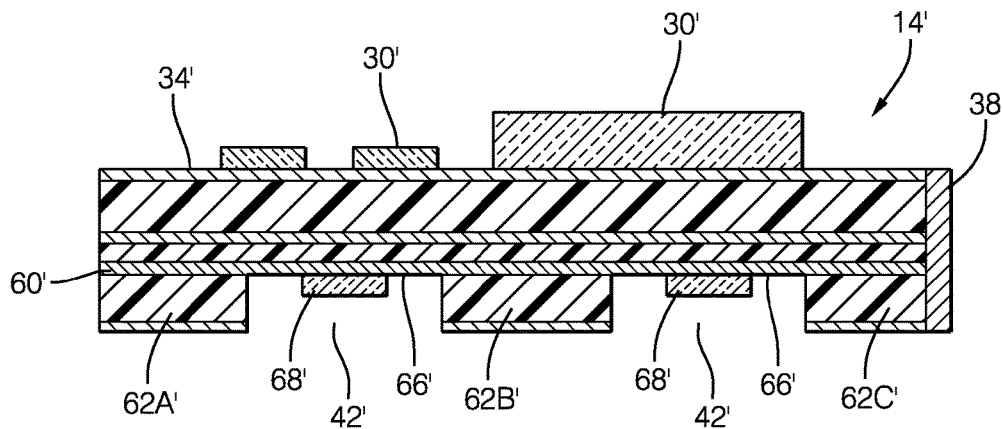
FIG. 5 is a side cut-away view of a daughter board according to another embodiment.

According to another embodiment of the daughter board shown in FIG. 5, the cavity 42' may be formed in the bottom surface 36' of the daughter board 14' by an additive process, such as laminating separate pieces of the bottom substrate 62A', 62B', 62C', rather than by removing material from the PCB 28. This may provide an exposed second inner conductive layer 60' that can be used to form conductive traces and conductive pads (not shown due to perspective) on a top surface 66' of the cavity 42', allowing additional electronic components 68' on the daughter board 14' to also be located within this cavity 42'. The conductive traces on the top surface 66' of the cavity 42' may be interconnected to the conductive traces 32' on the top surface 34' of the daughter board 14' by plated through hole vias (not shown).

The daughter boards 14, 14' in this example are configured so that they may be soldered to the mother board 12 using conventional surface mount component (SMC) fixtures, materials, and techniques.

Figure 6:
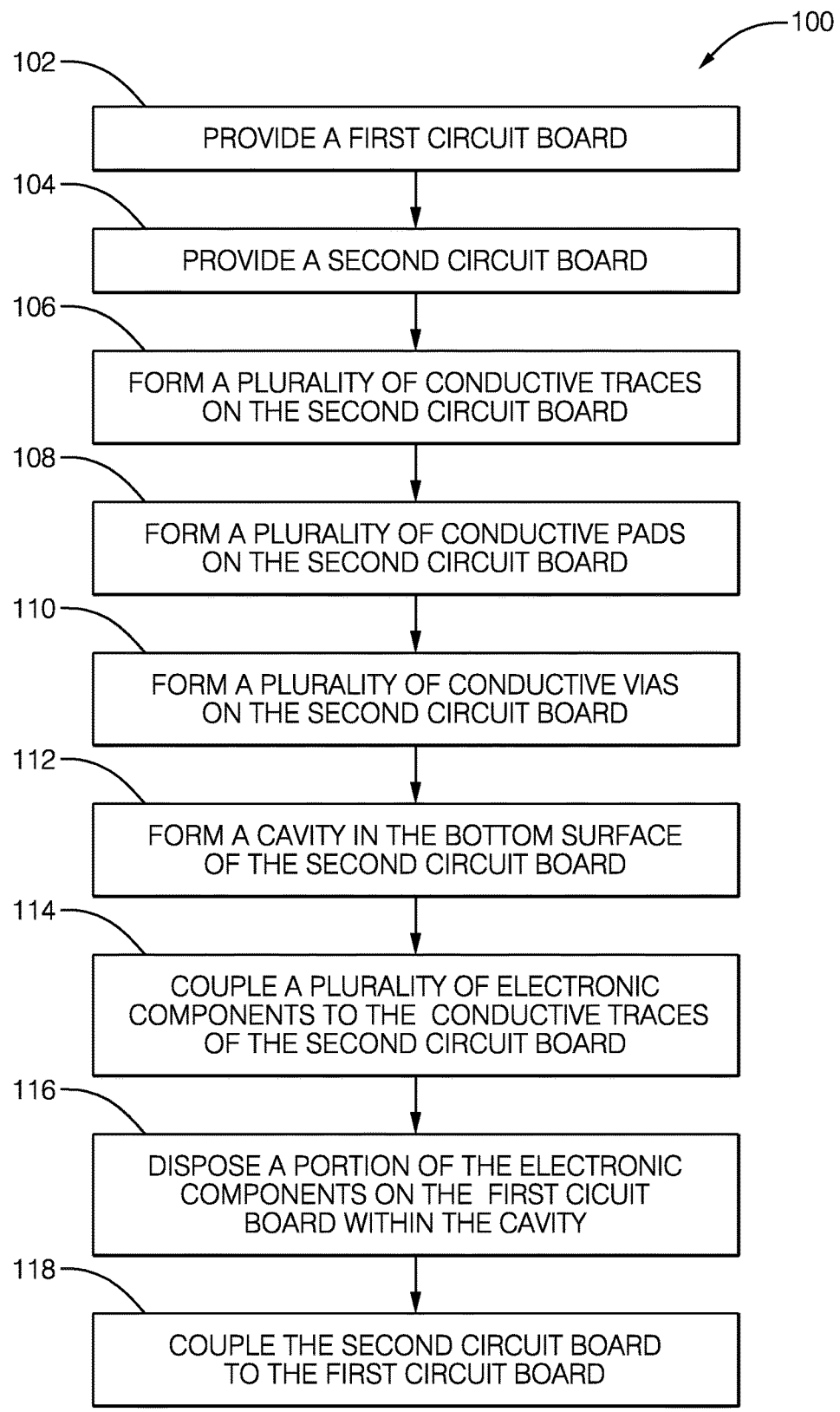
FIG. 6 is a flow chart of a method of manufacturing a circuit board assembly according to one embodiment.

FIG. 6 illustrates a method 100 of manufacturing a circuit board assembly 10 including a mother board 12 and a daughter board 14. The method 100 may include the following steps:

STEP 102, PROVIDE A FIRST CIRCUIT BOARD, includes providing a at least a PCB 16 for the mother board 12. The mother board 12 may also include a first plurality of electronic components 20, such as relays, resistors, capacitors, diodes, power transistors and/or blade terminals, attached to a top surface 18 of the PCB 16 of the mother board 12 and electrically interconnected with a first plurality of conductive pads 24 defined on the top surface 18 of the mother board 12. The first plurality of electronic components 20 are connected to the first plurality of conductive pads 24 by a conductive trace 22 formed on the surface of the mother board 12. The first plurality of electronic components 20 may be mechanically and electrically coupled to the conductive trace 22 by soldering.

STEP 104, PROVIDE A SECOND CIRCUIT BOARD, includes providing a PCB 28 for the daughter board 14.

STEP 106, FORM A PLURALITY OF CONDUCTIVE TRACES ON THE SECOND CIRCUIT BOARD, includes forming a plurality of conductive traces 32 on a top surface 34 of the PCB 28 of the daughter board 14.

STEP 108, FORM A PLURALITY OF CONDUCTIVE PADS ON THE SECOND CIRCUIT BOARD, includes forming a second plurality of conductive pads 26 on a bottom surface 36 of the PCB 28 of the daughter board 14.

STEP 110, FORM A PLURALITY OF CONDUCTIVE VIAS ON THE SECOND CIRCUIT BOARD, includes forming a plurality of conductive vias interconnecting the plurality of conductive traces 32 on the top surface 34 of the daughter board 14 to the second plurality of conductive pads 26 on the bottom surface 36 of the daughter board 14. The conductive traces 32 on the top surface 34 of the daughter board 14 may be connected to the second plurality of conductive pads 26 on the bottom surface 36 of the daughter board 14 by conductive castellated vias 38 defined in an edge surface 40 of the PCB 28 of the daughter board 14.

STEP 112, FORM A CAVITY IN THE BOTTOM SURFACE OF THE SECOND CIRCUIT BOARD, includes forming a cavity 42 in the bottom surface 36 of the daughter board 14. This cavity 42 may be formed by milling or grinding. It may also be formed during the fabrication of the PCB 28 of the daughter board 14 by laminating portions of circuit board substrate having different lengths, widths, and/or thicknesses. This cavity 42 may be characterized as a channel 42 in the bottom surface 36 extending from a first edge 44 of the daughter board 14 to a second edge 46 of the daughter board 14.

STEP 114, COUPLE A PLURALITY OF ELECTRONIC COMPONENTS TO THE CONDUCTIVE TRACES ON THE SECOND CIRCUIT BOARD, includes electrically and mechanically coupling a second plurality of electronic components 30, such as resistors, capacitors, and/or integrated circuits to the conductive traces 32 of the second circuit board. The second plurality of electronic components 30 may be mechanically and electrically coupled to the conductive trace by applying solder paste to the ends of the conductive traces 32, placing the second plurality of electronic components 30 on the applied solder paste and reflowing the solder paste to mechanically and electrically attach the second plurality of electronic components 30 to the daughter board 14 and the conductive traces 32. The second plurality of electronic components 30 may be attached using conventional SMC mounting techniques.

STEP 116, DISPOSE A PORTION OF THE ELECTRONIC COMPONENTS ON THE FIRST CIRCUIT BOARD WITHIN THE CAVITY, includes disposing a portion 48 of the first plurality of electronic components 20 on the top surface 18 of the mother board 12, preferably smaller components such as resistors, capacitors, and diodes, within the cavity 42 defined by the bottom surface 36 of the daughter board 14.

STEP 118, COUPLE THE SECOND CIRCUIT BOARD TO THE FIRST CIRCUIT BOARD, includes electrically and mechanically coupling the second plurality of conductive pads 26 on the bottom surface 36 of the daughter board 14 to the first plurality of conductive pads 24 on the top surface 18 of the mother board 12, thereby electrically and mechanically coupling the daughter board 14 to the mother board 12. The first plurality of conductive pads 24 may be soldered directly to the second plurality of conductive pads 26 by applying a solder paste the conductive pads 24 of the mother board 12, placing the conductive pads 28 of the daughter board 14 on the conductive pads 24 of the mother board 12, and reflowing the solder paste to mechanically and electrically attach the daughter board 14 to the mother board 12. The daughter board 14 may be placed on and attached to the mother board 12 using conventional SMC mounting techniques. The first plurality of electronic components 20 may be connected to the first plurality of conductive pads 24 on the top surface 18 of the mother board 12 at the same time the daughter board 14 is attached to the mother board 12.

Accordingly a circuit board assembly 10 and a method 100 of manufacturing a circuit board assembly 10 is provided. The circuit board assembly 10 provides a benefit over other circuit assemblies having a mother/daughter board configuration of allowing a smaller mother board 12 length and/or width since some of the smaller electric components on the mother board 12 are packaged beneath the daughter board 14. This circuit board assembly 10 also allows the higher power electronic components 20 (relays, resistors, power transistors, blade terminals) to be packaged on the mother board 12 while lower power electronic components 30 (capacitors, diodes, power integrated circuits) are packaged on the daughter board 14. This allows the use of thinner conductive traces 32 and smaller surface mount components 30 on the daughter board 14, since there may be less need for heat dissipation from the daughter board 14. The daughter board 14 does not include pins or terminals projecting from the bottom surface. The daughter board 14 is configured so that it can be mounted to the mother board 12 using standard SMC placement equipment, reducing manufacturing time and cost compared to daughter boards having pins and/or terminals connecting to the mother board.

While this invention has been described in terms of the preferred embodiments thereof, it is not intended to be so limited, but rather only to the extent set forth in the claims that follow. Moreover, the use of the terms first, second, top, bottom etc. does not denote any order of importance or particular orientation, but rather the terms first, second, top, bottom etc. are used to distinguish one element from another. Furthermore, the use of the terms a, an, etc. do not denote a limitation of quantity, but rather denote the presence of at least one of the referenced items.

I claim:

1. A circuit board assembly, comprising:
a first circuit board having a first plurality of electronic components attached to a major surface of the first circuit board and electrically interconnected by conductive traces with a first plurality of conductive pads defined on the major surface of the first circuit board; and
a second circuit board having a second plurality of electronic components attached to a first major surface of the second circuit board and electrically interconnected to a second plurality of conductive pads defined on a second major surface of the second circuit board opposite the first major surface, wherein the first plurality of conductive pads are electrically and mechanically coupled to the second plurality of conductive pads, wherein a portion of the first plurality of electronic components are disposed within a cavity defined by the second major surface, and wherein the cavity is characterized as a channel in the second major surface extending from a first minor surface of the second circuit board to a second minor surface of the second circuit board.

2. A circuit board assembly, comprising:
a first circuit board having a first plurality of electronic components attached to a major surface of the first circuit board and electrically interconnected by conductive traces with a first plurality of conductive pads defined on the major surface of the first circuit board; and
a second circuit board having a second plurality of electronic components attached to a first major surface of the second circuit board and electrically interconnected to a second plurality of conductive pads defined on a second major surface of the second circuit board opposite the first major surface, wherein the first plurality of conductive pads are electrically and mechanically coupled to the second plurality of conductive pads, wherein a portion of the first plurality of electronic components are disposed within a cavity defined by the second major surface, and wherein conductive traces on the first major surface are connected to the second plurality of conductive pads on the second major surface by conductive castellated vias defined in a third minor surface of the second circuit board.

3. A daughter circuit board assembly configured to be electrically and mechanically coupled to a mother circuit board assembly having a first plurality of electronic components attached to a major surface of the mother circuit board assembly and electrically interconnected by conductive traces with a first plurality of conductive pads defined on the major surface of the mother circuit board assembly, said daughter circuit board assembly comprising:
a circuit board having a second plurality of electronic components attached to a first major surface of the circuit board and electrically interconnected with a second plurality of conductive pads defined on a second major surface of the circuit board opposite the first major surface, wherein the second major surface defines a cavity configured to enclose a portion of the first plurality of electronic components of the mother circuit board assembly when the second plurality of conductive pads on the second major surface are electrically and mechanically coupled to the first plurality conductive pads on the major surface of the mother circuit board assembly and wherein the cavity is characterized as a channel in the second major surface extending from a first minor surface of the circuit board to a second minor surface of the circuit board.

4. A daughter circuit board assembly configured to be electrically and mechanically coupled to a mother circuit board assembly having a first plurality of electronic components attached to a major surface of the mother circuit board assembly and electrically interconnected by conductive traces with a first plurality of conductive pads defined on the major surface of the mother circuit board assembly, said daughter circuit board assembly comprising:
a circuit board having a second plurality of electronic components attached to a first major surface of the circuit board and electrically interconnected with a second plurality of conductive pads defined on a second major surface of the circuit board opposite the first major surface, wherein the second major surface defines a cavity configured to enclose a portion of the first plurality of electronic components of the mother circuit board assembly when the second plurality of conductive pads on the second major surface are electrically and mechanically coupled to the first plurality conductive pads on the major surface of the mother circuit board assembly and wherein conductive traces on the first major surface of the circuit board are connected to the second plurality of conductive pads on the second major surface of the circuit board by conductive castellated vias defined in a third minor surface of the circuit board.

5. A method of manufacturing a circuit board assembly, comprising the steps of:

providing a first circuit board having a first plurality of electronic components attached to a major surface of the first circuit board and electrically interconnected with a first plurality of conductive pads defined on the major surface of the first circuit board;

providing a second circuit board;

forming a plurality of conductive traces on a first major surface of the second circuit board;

forming a second plurality of conductive pads on a second major surface on the second circuit board opposite the first major surface;

forming a plurality of conductive vias interconnecting the plurality of conductive traces to the second plurality of conductive pads;

forming a cavity in the second major surface of the second circuit board;

electrically and mechanically coupling a second plurality of electronic components to the conductive traces of the second circuit board;

disposing a portion of the first plurality of electronic components within the cavity defined by the second major surface; and electrically and mechanically coupling the second plurality of conductive pads of the second circuit board to the first plurality of conductive pads of the first circuit board, wherein the cavity is characterized as a channel in the second major surface extending from a first minor surface of the second circuit board to a second minor surface of the second circuit board.

6. A method of manufacturing a circuit board assembly, comprising the steps of:

providing a first circuit board having a first plurality of electronic components attached to a major surface of the first circuit board and electrically interconnected with a first plurality of conductive pads defined on the major surface of the first circuit board;

providing a second circuit board;

forming a plurality of conductive traces on a first major surface of the second circuit board;

forming a second plurality of conductive pads on a second major surface on the second circuit board opposite the first major surface;

forming a plurality of conductive vias interconnecting the plurality of conductive traces to the second plurality of conductive pads;

forming a cavity in the second major surface of the second circuit board;

electrically and mechanically coupling a second plurality of electronic components to the conductive traces of the second circuit board;

disposing a portion of the first plurality of electronic components within the cavity defined by the second major surface; and electrically and mechanically coupling the second plurality of conductive pads of the second circuit board to the first plurality of conductive pads of the first circuit board, wherein the plurality of conductive traces on the first major surface of the second circuit board are connected to the second plurality of conductive pads on the second major surface of the second circuit board by conductive castellated vias defined in a third minor surface of the second circuit board.

* * * * *